United States Patent
Zhao et al.

(10) Patent No.: US 7,698,677 B2
(45) Date of Patent: Apr. 13, 2010

(54) ON-CHIP DECOUPLING CAPACITANCE AND POWER/GROUND NETWORK WIRE CO-OPTIMIZATION TO REDUCE DYNAMIC NOISE

(75) Inventors: Min Zhao, College Station, TX (US); Rajendran Panda, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 394 days.

(21) Appl. No.: 11/731,028

(22) Filed: Mar. 31, 2007

(65) Prior Publication Data

US 2008/0244497 A1  Oct. 2, 2008

(51) Int. Cl.
*G06F 17/50* (2006.01)
(52) U.S. Cl. ................ 716/10; 716/2; 716/13; 716/14
(58) Field of Classification Search ........ 716/2–4, 716/10, 13–14
See application file for complete search history.

(56) References Cited

U.S. PATENT DOCUMENTS

| | | | |
|---|---|---|---|
| 6,453,444 B1 * | 9/2002 | Shepard | 716/2 |
| 6,694,502 B2 * | 2/2004 | Mehrotra et al. | 716/12 |
| 6,700,404 B1 * | 3/2004 | Feng et al. | 326/41 |
| 6,711,727 B1 * | 3/2004 | Teig et al. | 716/12 |
| 7,412,668 B1 * | 8/2008 | Duong | 716/1 |
| 7,428,717 B1 * | 9/2008 | Duong | 716/6 |
| 2007/0096154 A1 * | 5/2007 | Shimbo et al. | 257/207 |

* cited by examiner

*Primary Examiner*—Stacy A Whitmore
(74) *Attorney, Agent, or Firm*—Dillon & Yudell LLP

(57) ABSTRACT

A semiconductor power network (100) decoupling capacitance (decap) budgeting problem is co-optimized with a wiring enhancement problem, wherein the solution is formulated to minimize the total decap to be added or wiring changes (addition of wires (420)) to be made to the network (100). Voltage constraints, available white space and other constraints determine the amount of decap to be added. Wire enhancements and/or added decap can be distributed throughout a violation region (120) of the semiconductor circuit (100) design to reduce dynamic supply voltage noise so that dynamic network voltages are at all times maintained greater than a user-specified threshold voltage level (220).

13 Claims, 5 Drawing Sheets

ON-CHIP DECOUPLING CAPACITANCE AND POWER/GROUND NETWORK WIRE CO-OPTIMIZATION TO REDUCE DYNAMIC NOISE

BACKGROUND OF THE INVENTION

1. Field of the Invention

The invention relates generally to a device and method of determining the amount and location of decoupling capacitance or enhanced local wiring to be added during the design and layout of a semiconductor circuit to optimally reduce dynamic supply voltage fluctuations during circuit operation.

2. Description of the Related Art

As the design and layout of semiconductor circuits, or microcircuits, or chips, become more complex, and in particular, as there is an increase in complexity of very large scale integration (VLSI) layout, an increase in operational frequency and the use of supply voltage scaling, there is an ever increasing need to remove or reduce undesired noise from the chip design. A chip's power distribution network is a major noise source as the fluctuations in supply voltage due to the parasitic resistance, inductance and capacitance in the network alter signals' voltage levels and can cause malfunctioning of the chip's circuits. Designing a robust power distribution network for low dynamic voltage fluctuations has become a challenging task. Extremely dense and complex circuit layouts for high frequency operation necessitate reduction of these undesired noise levels, especially at some sensitive parts of circuits such as clock generators and analog circuits. In general, it is important to improve the voltage fluctuations of all critical voltage violation regions (known as "hot spot regions") of a semiconductor circuit layout.

Static voltage drop (known as "IR drop") is usually addressed through increased metallization (reduction of resistance), pad placement, topology optimization and power-density-aware "floor planning." For limiting dynamic voltage fluctuations in a power network, the chief technique is to place one or more decoupling capacitors (known also as "decaps" in an abbreviated manner) close to a voltage violation hot spot region. This requires that there be sufficient white space, i.e., clear area on the chip, near the hot spot region. Sometimes circuit density does not allow sufficient white space to effectively add decaps near a hot spot region. Additionally, decaps alone are effective in suppressing noise only if placed very close to the noise sources.

For example, when a large gate such as a clock driver creates a sudden and high current demand, charge stored in a decap should be transported very quickly to that gate in order to reduce the supply voltage droop. If the path between the decap and the high current demand gate has significant resistance, then the charge transportation cannot occur as fast as required. This diminishes the effectiveness of the decap and requires more decap to be added. However, the decoupling capacitance density achievable may be limited by the process technology and by the limited amount of white space available around a problem spot. Because of this, it is not always possible to place the entire amount of required decap close enough to a hot spot region to achieve effective dynamic noise reduction.

As understood in the art, decap budgeting and placement is a non-linear optimization problem. Several known solution methods make very simple calculations for decap, resulting in overestimation. Other methods use non-linear optimization techniques involving some metric of dynamic supply noise. In another method, sensitivities of a noise metric to added decaps (which are known as adjoint sensitivities) are computed by simulating the original network and a derived network (known as the adjoint network) and then combining the waveforms from these two simulations in a mathematical process called convolution. The adjoint sensitivities are then used in a non-linear optimization using a quadratic solver.

In another proposed method in the art, the conjugate gradient (CG) method is used for optimization, wherein the gradients are computed using simplified adjoint sensitivity calculations. In another method, the known technique of divide-and-conquer is used to reduce the size of the sensitivity-based optimization. A further known method solves the nonlinear optimization through a sequence of linear programming methods. These methods are not practical for very large chip designs as the computation of adjoint sensitivities, or gradients, and the non-linear optimization are both very expensive in runtime and memory resources. In another method known in the art, the problem size is reduced using the geometric multigrid concept and then a sequential quadratic program method is used to optimize the reduced grid. Due to the use of geometric multigrid, this method works well only for very uniform power grid topologies.

Further complicating the problem, these techniques add decap and recompute sensitivity in an iterative procedure. As the complexity of one adjoint sensitivity computation is the same as one transient analysis, the iterative nonlinear optimization procedure becomes quite expensive and time consuming. In addition, the adjoint sensitivity calculation typically needs to store waveforms at every node in both the original and the adjoint networks, which may exhaust the memory resource for large networks.

Several charge-based decap estimation techniques have also been proposed in the art in the context of power supply noise-aware floor planning. An approximate lumped decoupling capacitance is estimated for each floor plan module, with an assumption that the original voltage of decoupling capacitance is a perfect VDD voltage reference; however, the parasitic capacitance and existing decap value are not considered in these methods, which causes inaccuracies.

Because of limitations of these known solution methods, there is a need for an improved method or process of decap optimization.

BRIEF DESCRIPTION OF THE DRAWINGS

This invention is described in preferred embodiments in the following description with reference to the drawings, in which like numbers represent the same or similar elements, as follows.

Figure 1:
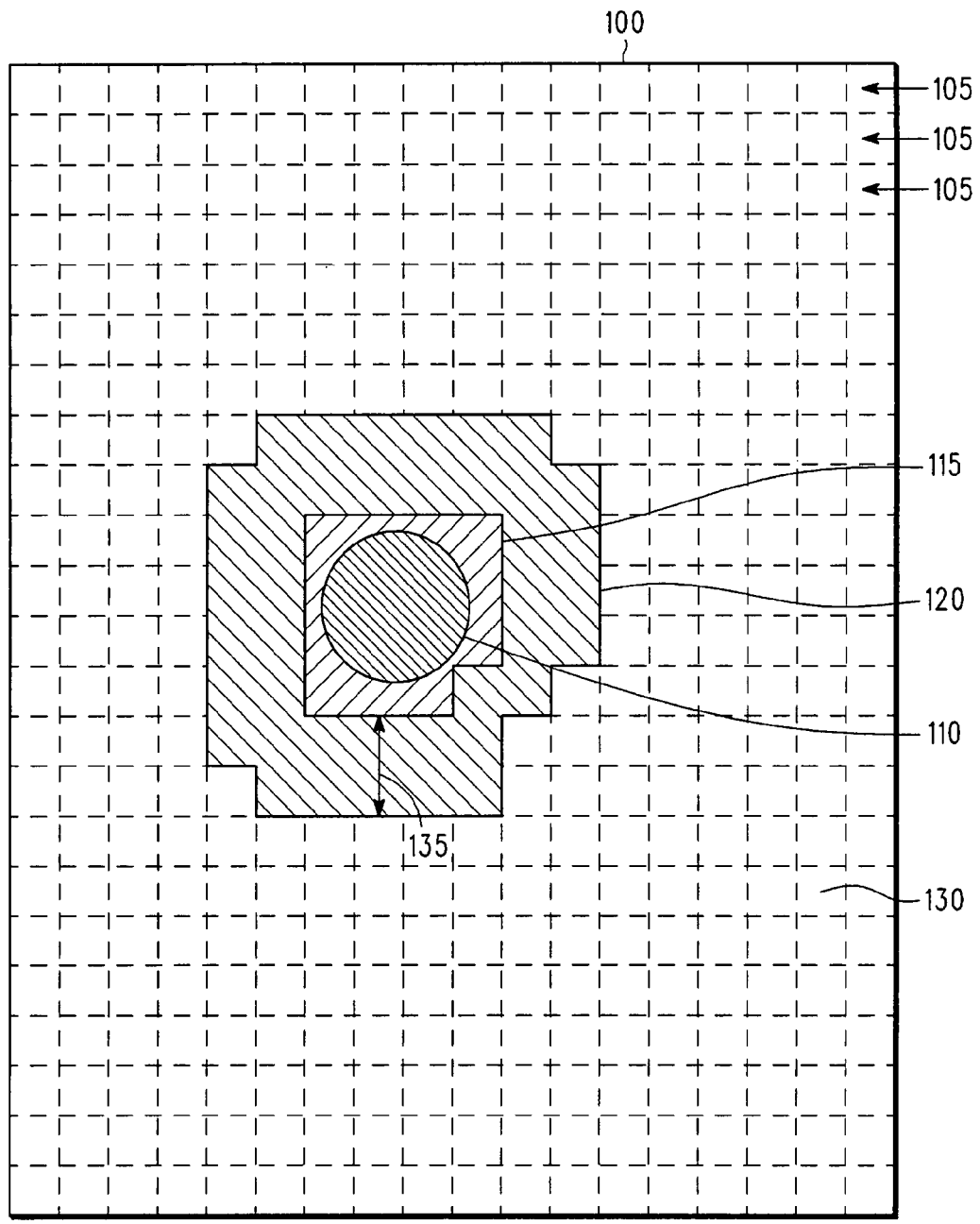
FIG. 1 is a schematic of an integrated circuit layout showing a voltage violation hot spot region according to preferred embodiments of the invention.

In the following detailed description of exemplary embodiments of the invention, reference is made to the accompanying drawings, which form a part hereof, and in which is shown by way of illustration specific exemplary embodiments in which the invention may be practiced.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the invention. The following detailed description is, therefore, not to be taken in a limiting sense, and the scope of the invention is defined only by the appended claims.

The method of a preferred embodiment eliminates the problems of the techniques found in the prior art and determines the optimal amount of and the location for decaps, to reduce dynamic supply noise in a circuit quickly and accurately. The method of a preferred embodiment also determines whether local wiring enhancements should be made to further reduce dynamic voltage fluctuations on the chip. A method of a preferred embodiment proposes a novel and efficient charge-based decoupling capacitor budgeting method. Several techniques are described herein which can be used to reduce the hot spot problem size and also to have the problem size scale well with respect to the network size and the number of violation nodes of the network. Macro modeling is used and the locality effects of the decoupling capacitance, along with non-uniform tiling, are considered. By integrating the nodal equations over the violation time period of a reduced voltage level, time-consuming sensitivity calculations and nonlinear programming optimization are replaced with a much faster and more efficient sequence of linear programming steps.

A method of a preferred embodiment performs, without limitation, the steps of: (1) dividing the circuit design and layout into small areas of approximately equal area ("tiles"); (2) determining which groups of tiles have the worst voltage drop, and are therefore considered "hot spots" in need of a decap device to reduce noise to an acceptable level (i.e., to maintain a user-specified threshold voltage) in that hot spot region; (3) determining an optimal value and location for a decap device to be inserted into the hot spot region group of tiles, assuming that the entire capacitance value to be added is to be connected to the node of the tile having the largest voltage drop; and (4) distributing uniformly within the hot spot region tiles the value of the decap to be added in a manner that optimally provides the best solution for the power network and load in that hot spot region.

In a preferred embodiment, the decap budgeting problem is formulated to minimize the total decap subject to voltage constraints on the network nodes, and constraints on the decap amount are taken into consideration such that the decap can be distributed throughout a hot spot region and not limited to placement at a single location in the circuit. A preferred embodiment aims at realizing dynamic voltages that are at all times maintained greater than a user-specified threshold voltage level.

A preferred embodiment uses a novel approach wherein voltage constraints and excitation currents are translated into charge-based constraints in a linear program. Since a general non-linear optimization formulation is very time consuming, the approach first linearizes the charge-based constraints through certain approximations (to be explained in greater detail below) and then performs a small number of iterations to account for the non-linearity. A small linear program is solved during each iteration of the method of a preferred embodiment. Concepts of macro modeling and effective radius of capacitance are used for problem size reduction. Through reduction, a small macro model of a network, or portion of a network, is created having few nodes, where the nodes are the potential sites for decap connection. The charge-based constraints then govern the charge transfer from the decaps to the rest of the network in the VLSI circuit.

The approach differs from prior known approaches in many respects, for example: (1) the charge basis of constraints, formed through integration of the nodal equations over a time period of interest, simplifies computations substantially. It eliminates the need to solve the nodal equations directly; (2) the size of the problem is reduced using a macro model, which is an exact equivalent of the full network, or portion of the network, of the VLSI circuit, rather than through partitioning or multigrid coarsening; and (3) the decap pre-existing in the network and the decap to be added to the network are accounted for in different ways. The intrinsic decap of devices and interconnect and pre-placed decap cells are modeled inside the macro model through their companion electrical models placed in the network before the macro modeling procedure. Any additional decap that is optimized is external to the macro model, and is connected at the model's external nodes (model nodes).

For co-optimization, another method of a preferred embodiment suppresses dynamic noise on the chip by decreasing the resistances between large current sinks and the decap or supply pads. This can be done by sizing up the local wires around the current sinks and creating additional paths to supply pads or decap locations. The term sizing up refers to increasing the width of the paths, which decreases the resistance of the paths and increases the current carrying ability. As described below in Section 5, there are often situations where a hot-spot node is located physically close to another node which itself is connected well to the supply voltage, but the connection between these two nodes is highly resistive. Adding local connections between these two nodes may dramatically decrease the decap required in that region. Co-optimizing wires to reduce dynamic noise is a benefit for several reasons, including: (1) Reducing wire resistance reduces both the DC noise (IR drop) and the high-frequency AC noise (due to reduced resistance of discharge paths); (2) Locations that are congested for adding decap circuits may not be so congested for adding additional wires, as decap circuits largely use the device layers while the P/G wiring uses the metal routing layers; and (3) While additional decaps add to circuit area, increase leakage, and pose a higher risk for yield, adding or sizing up wires does not cause such problems.

Herein is described a method for co-optimization of decoupling capacitance and local wiring enhancement. The wiring enhancement could be both wire sizing and topology changes. Previous methods of addressing the decap and wiring co-design issues are limited to regular mesh structures, whereas the method described herein works for regular as well as irregular P/G networks. In practice, P/G networks are not completely regular. The wire optimization method herein described can accomplish both wire sizing, as well as topology changes through the addition of new wires. The method described herein accomplishes the co-optimization through several iterations of linear programming on a reduced problem size and does not require costly adjoint sensitivity calculation of voltages with respect to decaps and wires.

The co-optimization problem is formulated as a constrained minimization. The solution aims at minimizing the overall area cost of decap and wires while realizing dynamic voltages greater than a user-specified threshold level at all times. Basically, the decap/wire co-optimization uses the synergy between decap optimization and wire optimization.

In determining the location and value of a decoupling capacitance to be added to the design and layout of a VLSI semiconductor circuit, or chip, or other semiconductor circuit, an embodiment of the method of a preferred embodiment involves, without limitation, the steps of: (1) performing a power grid simulation for a semiconductor chip's power grid, or power network (described below in Section I.); (2) determining a macro model of the semiconductor chip's power network (described below in Section II.); (3) performing a decoupling capacitance optimization calculation (described below in Section III.); (4) performing a wire optimization calculation (described below in Section IV); and (5) performing a decap/wire co-optimization calculation using a linear programming solution (described below in Section V). Further enhancements and embodiments of the methods of a preferred embodiment are described below within each of the Sections I-V, below.

I. Power Grid Simulation

A chip's power distribution system is modeled as a linear RLC network with independent time-varying current sources modeling the switching currents of the transistors. Simulating the network requires solving the following system of differential equations, which are formed in a typical approach such as a Modified Nodal Analysis ("MNA") approach:

$$G \cdot x(t) + C \cdot x'(t) = b(t), \quad (1)$$

where G is a conductance matrix, C is the admittance matrix resulting from capacitive and inductive elements, x(t) is the time-varying vector of voltages at the nodes, and currents through inductors and voltage sources, and b(t) is the vector of independent time-varying current sources. This differential system is very efficiently solved by reducing it to a linear algebraic system, as follows:

$$(G + C/h) \cdot x(t) = b(t) + C/h \cdot x(t-h), \quad (2)$$

using the Backward Euler (BE) technique with fixed time step, h.

II. Macro-Modeling

If there is a concern only about a selected part of the power network, nodes in this part of the network, called sampling nodes, can be defined as ports to a multi-port reduced network and all other nodes in the network are abstracted away. The multi-port network can be modeled with current transfer characteristics the same as a MNA, as follows:

$$I_{ext} = A \cdot V + I, I_{ext}, V, I \in R^m, A \in R^{m \times m} \quad (3),$$

where m is the number of ports in the model, A is the ports admittance matrix, V is the vector of voltages at the ports, I is the vector of the equivalent current sources connected between each port and the reference node, and $I_{ext}$ is the vector of unknown currents flowing into the ports from the external surroundings. The reference node is an actual node physically located within a tile in the hot spot region of the circuit of the chip.

Macro modeling is the procedure of deriving macro model equation (3) from a MNA of the entire power grid, which can be written as:

$$[G_{11} G_{12}][U_1] = [J_1]$$

$$[G^T_{12} G_{22}][V][J_2 + I] \quad (4),$$

where $I_{ext}$ is the vector of unknown currents flowing through the ports, and $U_1$ and V are vectors of voltages at the internal nodes and ports respectively, $J_1$ and $J_2$ are vectors of current sources connected at the internal nodes and ports respectively, and $G_{12}$, $G_{11}$, and $G_{22}$ are block admittance matrices. From equation (4), the first set of equations can be rewritten and then substituted into equation (2) to get:

$$I_{ext} = (G_{22} - G^T_{12} G^{-1}_{11} G_{12}) V + (G^T_{12} G^{-1}_{11} J_1 - J_2) \quad (5).$$

Here, $G^T_{12} G_{11}^{-1} J_1 - J_2$ is the constant vector I in equation (3) and $G_{22} - G^T_{12} G_{11}^{-1} G_{12}$ is the port admittance matrix A in equation (3). Alternatively, a macro model can also be obtained through Gaussian elimination or other more efficient procedure.

Note that all the capacitors in the network (including the intrinsic and pre-placed decoupling capacitors) have been modeled in equation (4) through their companion models using the BE technique. Therefore, the macro model derived from equation (4) models these elements too.

III. Decap Optimization

3.1 Violation Region Sampling Nodes, and Violation Time Window

FIG. 1 illustrates the design of a semiconductor circuit, or power network, 100. Network 100 is preferably a design of a semiconductor circuit, but in other embodiments may be a physical semiconductor circuit. Network 100 is partitioned into a grid of user-specified uniformly sized tiles 105 using pre-defined x and y pitches, where the pitch is the x or y dimension of the tile. Tiles 105 can be squares, rectangles or other geometric shapes formed by x and y pitches. A hot spot region 110 is shown as a circular shaded area in the center of FIG. 1 and is the region of the network 100 where the user-specified voltage constraints are violated at any time instance. Hot spot region 110 may be of any shape, but is shown as a circle for simplicity in this embodiment. The set of contiguous tiles 105 which overlays the entire hot spot region 110 of network 100 defines a core violation region 115.

Core violation region 115 is then expanded in all directions by a pre-determined distance, known as the effective radius 135, to include additional tiles 105 to form a violation region 120. The effective radius 135 is the radius from the core violation region 115 within which the added decap is effective in supplying current quickly to meet the sudden current demands of the hot spot region 110. Core violation region 115 is expanded solely for the purpose of making a larger area available in which to add decap capacitance should the optimization method determine that a substantial amount of capacitance needs to be added. The trade-offs in considering a smaller versus larger (conservative) effective radius 135 are as follows:

a) a smaller effective radius 135 will limit the amount of capacitance (decap) that can be added. Thus, the optimization will be over-constrained resulting in poor quality results; and b) a larger, more conservative, effective radius 135 will allow optimization to proceed unconstrained. The optimization will automatically determine how to distribute the required decap capacitance within the violation region 120. The optimization process inherently determines that more decap capacitance should be added closer to the hot spot region 110 and less capacitance should be added further from the hot spot region 110. A larger effective radius 135 requires increased time to solve the optimization, but this is not significant versus the accuracy and speed of the optimization process over prior methods.

The effective radius 135 is conservatively selected and is user-defined. Effective radius 135 essentially is a measure of how far away from the hot spot region 110 the decaps should be placed to have a reasonable effect on reducing noise within the hot spot region 110. Effective radius 135 depends on the effective resistance of a signal path (not shown), which is determined by the technology node, the current variation, and the metalization used in each layer of network 100. The effective radius 135 is measured as a number of tiles 105 which form a violation region 120, such that after adding decaps in the violation region 120 the user selected threshold voltage, $V_{thre}$, would no longer be violated within the hot spot region 110.

The number of tiles (N) in the effective radius 135 is determined. If the resistance of a signal path (not shown) the length of a tile 105 is R ohms, and if a decap is located N tiles away from the hot spot region 110, then the resistance between the decap and hot spot region 110 is bounded by N*R ohms. A fraction (k), selected to be between 0.1% and 1%, of the peak current demand (I) is to be delivered to the hot spot region 110 from the farthest tile 105. The voltage drop between the decap in the farthest tile 105 and the hot spot region 110 is k*I*N*R volts. Equating that to the targeted maximum voltage drop ($\Delta V$), then number of tiles 105 for effective radius 135 is N=$\Delta V$/(k*I*R).

No further expansion beyond the effective radius 135 is performed, since at this point, decap added outside the expanded space of violation region 120 would have little or no impact on the performance of voltages within core violation region 115. Moreover, the additional area within violation region 120 provides more space to add decaps. The large area of network 100 outside the violation region 120, depicted as outer network 130, can be abstracted away by reducing those nodes in outer network 130 to the macro model equations (3) and (4).

There is typically more than one violation region 120 within a network 100, though, for simplicity, only one is depicted in the FIG. 1. By running the optimization independently on additional violation regions 120 (not shown), the problem size is reduced significantly. This also brings in an opportunity for parallelization. If two or more violation regions 120 overlap each other, then these regions are optimized together simultaneously. Optimizing them separately in such cases would result in sub-optimal results since the strong interaction of capacitances and voltages across those regions would be ignored.

Sampling nodes (not shown) are representative nodes sampled from each tile 105 having a voltage violation. A voltage violation occurs where the voltage level detected at a sampling node falls below a user specified minimum threshold voltage level $V_{thre}$. A few (less than 10) nodes per tile 105 having the worst voltage violations within the tiles 105 are sampled to represent the behavior of all nodes in those violation tiles 105. The process keeps the size of the tiles 105 small enough for this assumption to be valid. The remainder of the nodes are abstracted away by macro modeling. The optimization assumes that all the decap is added at the sampling nodes. After solving the LP, however, the decaps at the sampling nodes are evenly distributed among all the nodes in the tiles 105 of the hot spot region to which the sampling nodes belong.

Figure 2:
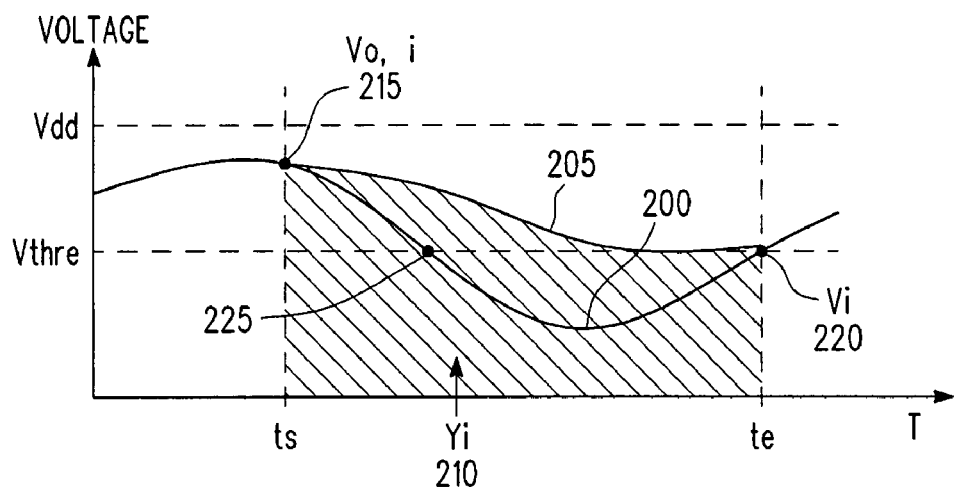
FIG. 2 is a diagram illustrating a sample worst voltage violation within a tile before and after decap is added according to preferred embodiments of the invention.

FIG. 2 shows two voltage waveforms: a violation voltage waveform 200 and an optimized voltage waveform 205. Waveform 200 represents the voltage level at a sampling node in a hot spot region 110 (FIG. 1) that falls below a minimum threshold level during a time period, as illustrated. Waveform 205 represents the voltage level at the same sampling node after decap has been added subsequent to the optimization method of one of a preferred embodiments.

As shown in FIG. 2, a violation time window for a sampling node of the hot spot region 110 (FIG. 1) is determined from the violation voltage waveform 200 at that sampling node obtained through the dynamic analysis of the power network 100 (FIG. 1). An example of a violation time window $[t_s, t_e]$ is shown, where $t_s$ is the time instance of maximum voltage of violation voltage waveform 200 at point 215 ($V_{o,i}$) which occurred before a voltage violation condition at point 225 and $t_e$ is the time instance when the voltage level $V_i$ of violation voltage waveform 200 recovers back to $V_{thre}$ level at point 220 after a voltage violation condition. The voltage violation condition occurred between point 225 and point 220 while the level of violation voltage waveform 200 was less than $V_{thre}$. This time frame, that is, the time during which the violation voltage waveform 200 was in violation, is the violation time window. After optimization and the addition of decap in violation region 120 (FIG. 1), the voltage level of optimized voltage waveform 205 at $t_s$ ($V_{o,i}$ at point 215) is assumed to be the initial voltage of the decap before discharge and, as is shown, the voltage level of waveform 205 remains above threshold level Vthre at all times. Therefore, there is no violation time window for optimized voltage waveform 205.

3.2 Charge-Based MNA Constraints

The power network is reduced to a charge-based macro model, with the sampling nodes used as ports of a multi-port reduced network, by integrating equation (4) over the violation time window, $[t_s, t_e]$, as follows:

$$[G_{11} G_{12}][\int^{te}_{ts} U_1 dt] = [\int^{te}_{ts} J_1 dt]$$

$$[G^T_{12} G_{22}][\int^{te}_{ts} V dt][\int^{te}_{ts} J_2 dt + \int^{te}_{ts} I_{ext} dt].$$

Then, using the macro modeling procedure described above in Section 2.2, a charge-based macro model is obtained as shown in equation (6), below:

$$Q = A \cdot Y + B, \qquad (6)$$

where A is $G_{22} - G^T_{12} G^{-1}_{11} G_{12}$, Q is $\int^{te}_{ts} I_{ext} dt$, Y is $\int^{te}_{ts} V dt$, and B is $(G^T_{12} G^{-1}_{11} \int^{te}_{ts} J_1 dt - \int^{te}_{ts} J_2 dt)$. As each equation of (3) is a Kirchhoff's Current Law ("KCL") equation, then equation (6) implies that the total charge flowing out of each node over the integration period is zero.

The optimization procedure determines the amount of decap, $C_i$, which is to be placed at every node i in the set of sampling nodes (SP). $Q_i$ is the charge flowing from the decap $C_i$ into the macro model, approximated as: $C_i \times (V_{o,i} - V_i)$, where $V_{o,i}$ and $V_i$ are the voltages at $t_s$ and $t_e$, respectively. In order to keep the voltage above $V_{thre}$, sufficient charge should be released from the decap. Working with the objective of minimizing $\Sigma_{i \in SP} C_i$ together, the equality constraints equation (6) could be relaxed to form inequality constraints of equation (7) below:

$$M \circ C \geq A \cdot Y + B, \qquad (7)$$

where $M=[V_{0,1}-V_{0,2}-V_2 \ldots V_{0,m}-V_m]^T$ and $C=[C_1, C_2, \ldots C_m]^T$. The $\circ$ operation represents the entry-wise product of vectors M and C

3.3 Charge-Based Voltage Constraints

Referring again to FIG. 2, a voltage waveform is shown at a node before and after adding decap. The objective of adding decap is to pull up the voltage and to maintain a voltage level above the $V_{thre}$ level at all times.

The shaded area $Y_i$ in the figure represents $Y_i = \int_{t_s}^{t_e} V dt$. Suppose $V_{0,i}$ and Vi represent the voltage of node i at time points $t_s$ and $t_e$, respectively. By approximating the upper voltage waveform to a straight line between $t_s$ and $t_e$, Y can be written as:

$$Y_i \cong (V_{0,i}+V_i)*(t_e-t_s)/2, i \in SP, \quad (8)$$

where SP is the set of sampling nodes (i.e., ports of the multi-port reduced network). By assuming the voltage at $t_e$ (i.e., $V_i$), as the worst voltage within the violation time window, the constraints that the dynamic node voltage levels are higher than a specified threshold is approximated as:

$$Y_i \geq (V_{0,i}+V_{thre})*(t_e-t_s)/2, i \in SP. \quad (9)$$

3.4 Sequence of Linear Programming (SLP)

The decap optimization for a violation region is formulated as a sequence of linear programming ("LP") steps. In each iteration, the LP procedure is formulated as follows:

$$\text{minimize } \Sigma_{i \in SP} C_i \quad (10)$$

subject to $Y \geq E$ $M \circ C \geq A \cdot Y + B$ $\Sigma_{k \in tile_i} C_k \leq C_{max,i}, \forall$ tile $i \in$ violation region, where $m=|SP|$, $C=[C_1, C_2, \ldots, C_m]^T$, $$M_- = \begin{bmatrix} V_{0,1} - V_1 \\ V_{0,2} - V_2 \\ \ldots \\ V_{0,m} - V_m \end{bmatrix},$$

$$E = \begin{bmatrix} (V_{thre} + V_{0,1}) \times (t_e - t_s)/2 \\ (V_{thre} + V_{0,2}) \times (t_e - t_s)/2 \\ \ldots \\ (V_{thre} + V_{0,m}) \times (t_e - t_s)/2 \end{bmatrix},$$

Here, vector C and Y are variables of the LP optimization. M is assumed to be a constant vector, decided by the node voltages of the previous iteration. $C_{max,i}$ represents the decap constraint of tile i. In each iteration, the LP technique is performed to determine the decap amount required. Then the reduced network with the new decap is solved to get the updated voltages. M is then recalculated with the new voltage and used in the next iteration.

IV. Wire Optimization

Figure 3:
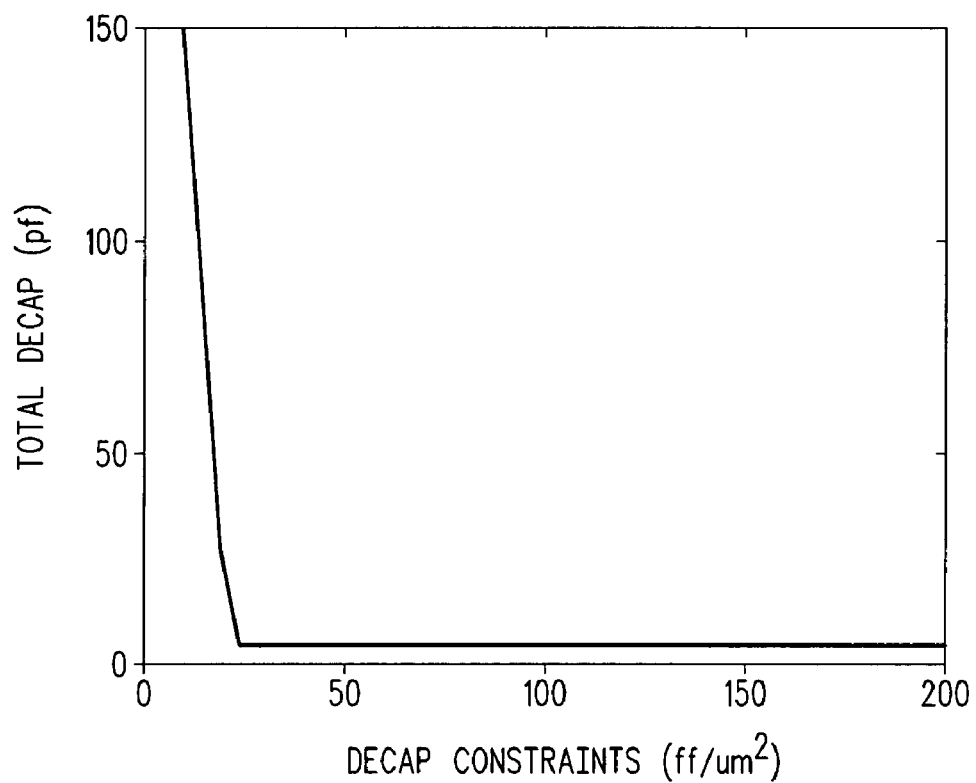
FIG. 3 is a graph illustrating how an increase in decap constraints limits the total amount of decap that can be effectively implemented to suppress dynamic noise fluctuations according to preferred embodiments of the invention.

FIG. 3 illustrates the impact of decap constraint on the total amount of decap required for limiting the supply noise to be within 10% of supply voltage Vdd (from FIG. 2) in a semiconductor chip design. Decap constraint, is defined as the maximum amount of decap allowed per unit area, which is the product of decap density of the decap cells (decap per unit area) and vacancy ratio (white space divided by total area). The total decap amount needed increases dramatically when decap constraints are tightened.

Figure 4:
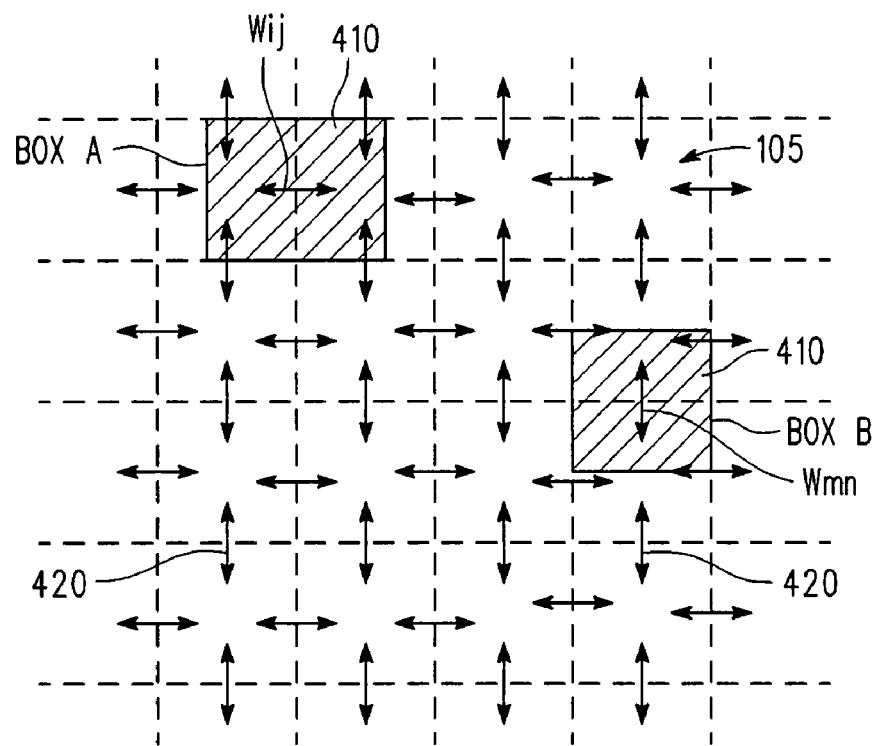
FIG. 4 is a diagram illustrating the power grid divided into regions and showing wire candidates between sampling nodes of tiles according to preferred embodiments of the invention.

Referring now to FIG. 4, the power grid of network 100 (FIG. 1) is divided into box regions 410, shown as Box A and Box B. Each box region 410 includes portions of tiles 105. When electrical connectivity between two adjacent tiles 105 via power/ground wires 420 is improved, charge in one tile 105 can be transferred more effectively to the other tile 105. If a tile 105 adjacent to a tile 105 in a violation region 120 (FIG. 1) has a very stable voltage, then connecting (or enhancing the connectivity between) those two tiles 105 will bring dramatic improvements to the violation region 120. Potentially, wires 420 can be added or enhanced between any two nodes of any two tiles 105 in the network 100. Considering all such connections and optimizing them will be impractical and unnecessary. To simplify the problem, only four basic connections are considered for any tile 105, i.e., the connections to its four neighboring tiles 105. With these four basic connections, any two distant tiles 105 in the chip design, or on a physical chip circuit, can be connected together, if necessary, through a chain of connections. If the optimizer determines that it is best to connect a box region 410 sitting N tiles away to a violation region 120, then a sequence of adjacent connections will be established automatically to achieve this.

The P/G wire, or decap/wire, co-optimization is the synergy between decap optimization and wire optimization. The wire optimization method described herein is different from previous wire optimization methods in at least two respects: (1) The method of a preferred embodiments formulates wire 420 sizing as a sequence of linear programming steps ("SLP"), whereas in prior methods this was done as a two-step iterative optimization which utilizes a current-fixed optimization and a voltage-fixed optimization, and then uses SLP to solve the current-fixed optimization problem; and (2) To reduce the problem complexity, additional metallization needed between box regions 410 (or tiles 105) through the above SLP wire optimization is first determined and then the additional metallization is implemented through detailed routing of wires 420 between these box regions 410 or tiles 105.

4.1 Sequence of Linear Programming

For a network 100 (FIG. 1) having millions of nodes, it is impractical to optimize the entire network 100 even with the SLP formulation described in this Section. Metallization between neighboring regions of the network 100 is first determined with the optimization procedure described herein, and then the additional metallization is implemented through detailed routing between the regions.

The solution to the wire optimization problem minimizes the total area in which wires 420 are to be added, subject to the constraints that: (i) the node voltages are higher than a user-specified minimum threshold voltage, $V_i^k \geq V_{thre}$; (ii) the node voltages satisfy the MNA equations of the network; and (iii) the wire widths are bounded, $W_{ij} \leq W_{max,ij}$.

Given a network 100 (FIG. 1), the MNA equations of a system with existing wires and wires to be added could be written as:

$$(A'+A) \cdot V + I = 0 \quad (12)$$

where A is the conductance of existing network, and A' is the conductance to be added. Working with the optimization objective of minimizing total wires 420, equation (12) is relaxed to inequality constraints and rewritten as:

$$-\Sigma_{1 \leq j \leq m} A'_{ij} V_j \geq \Sigma_{1 \leq j \leq m} A_{ij} V_j + I_i, \forall i \in SP \quad (13)$$

where m is the number of nodes in the network. The term "$-\Sigma_{1 \leq j \leq m} A'_{ij} V_j$" represents the total current flowing into node i through the wire candidates of node i. Combined with constraints $V_i \geq V_{thre}$, the constraints in equation (13) indicate that in order to keep the voltage at node i above $V_{thre}$, sufficient current needs to flow through the wire candidates. Since both $V_j$ and $A'_{ij}$ are variables, the constraints of equation (13) are not linear. The term "$-\Sigma_{1 \leq j \leq m} A'_{ij} V_j$" is linearized through an iterative linear programming procedure. The $V_j$ variables in the term "$-\Sigma_{1 \leq j \leq m} A'_{ij} V_j$" are treated as constants in LP and obtained from the previous iteration.

If a wire candidate's length and width are $L_{ij}$ and $W_{ij}$, respectively, where $\rho$ is the resistivity of the wire 420, then a total current of $W_{ij}(V_j-V_i)/\rho L_{ij}$ flows through the wire 420 from node j into node i. Hence, the left hand side of equation (13) becomes:

$$-\rho_{1 \leq j \leq m} A'_{ij} V_j = \Sigma_{1 \leq j \leq m}[(W_{ij}V_j)/\rho L_{ij}] - \Sigma_{1 \leq j \leq m}[W_{ij}V_i]/\rho L_{ij}]. \quad (14)$$

In equation (14), $V_i$, $V_j$ are treated as constants and $W_{ij}$ as variables. So, without loss of generality of row and column indices, the term "$-\Sigma_{1 \leq j \leq m} A'_{ij} V_j$" can be rewritten as a product of a constant matrix D and a variable vector W, as follows:

$$-A' \cdot V = \begin{bmatrix} (V_2-V_1)/\rho L_{12} & (V_3-V_1)/\rho L_{13} & (V_4-V_1)/\rho L_{14} & \cdots \\ (V_1-V_2)/\rho L_{12} & & & \cdots \\ & (V_1-V_3)/\rho L_{13} & & \cdots \\ & & (V_1-V_4)\rho L_{14} & \cdots \\ \vdots & \vdots & \vdots & \cdots \\ \vdots & \vdots & \vdots & \cdots \\ \vdots & \vdots & \vdots & \cdots \end{bmatrix} \quad (15)$$

D matrix $$\begin{bmatrix} W_{12} \\ W_{13} \\ W_{14} \\ W_{15} \\ \vdots \\ \vdots \\ \vdots \end{bmatrix}.$$

W matrix

Here, W represents the widths of the wire candidates and each column of matrix has two non-zero elements. Then, the MNA constraints of equation (13) become:

$$D \cdot W \geq A \cdot V + I. \quad (16)$$

Thus, the LP formulation of wire optimization is as follows:

$$\text{minimize } \Sigma_{i,j} W_{ij} L_{ij} \quad (17)$$

$$\text{subject to } V \geq [V_{thre}, V_{thre}, \ldots]^T \quad (18)$$

$$D \cdot W \geq A \cdot V + I \quad (19)$$

$$W_{ij} \leq W_{max,i,j}, \forall ij \in \text{wire candidates}. \quad (20)$$

The constant parameters D here evaluate the charges flowing through the wire candidates and rely on the voltages of the nodes in the current LP iteration. The wire optimization procedure executes multiple iterations. In each iteration, the LP equation (17) is performed to determine the wire widths to be added. Then the network 100 (FIG. 1) with the new wires 420 is solved to get the updated voltages. D is then recalculated with the new voltages and used in the next iteration. The iterations of solving LP equation (17) and updating the wires 420 and voltages continue until voltages of all nodes are greater than the threshold voltage, $V_{thre}$.

4.2 Region-Wise Wire Enhancement

While considering tiles 105 (FIGS. 1, 4), the SLP optimization problem is reduced in size dramatically. One sampling node in each tile 105 is selected to represent all the nodes in that tile 105 and macro modeling is used to reduce the original network 100 to a reduced network consisting only of sampling nodes. The SLP wire optimization is executed on the reduced network. The size of the reduced network could be orders of magnitude smaller than that of the original network 100. In the constraints of equation (19) of the LP formulation (17), the MNA equations of wire optimization are replaced with macro model equations (3), where only variables of the sampling nodes remain. Referring to FIG. 4, $W_{ij}$ in equation (17) now represents the wires 420 that cross the boundary of a tile i and a tile j. Suppose m is the size of the sampling nodes. Because wiring enhancements are determined only between adjacent pairs of nodes, then |W|<2 m and D is a sparse m×|W| matrix with at most four elements in each row. In wire width constraints equation (20), $W_{max,ij}$ in constraints $W_{ij} \leq W_{max,ij}$ are determined by the available routing track in tiles i and j. This information can be easily obtained from the routed layout.

After optimization, the added metallization between two neighboring tiles 105 (represented by a pair of sampling nodes) is distributed within their corresponding box regions 410. Suppose for Box region A the optimizer determines that $W_{ij}$ as the additional metallization between tiles i and j, then $W_{ij}$ is routed within the Box A region. Similarly $W_{mn}$ is distributed within Box region B, as shown in FIG. 4. In fact, on occasion, chip designers prefer to get a high level guidance such as how much metal should be added between two tile regions for wiring improvement, rather than using the optimizer to make detailed changes to the wiring topology to add wires 420.

Since one sampling node is used to approximately represent an entire tile 105, all the nodes in a tile 105 should have the similar voltage behavior. Suppose $V_{min,i}$ and $V_{max,i}$ are the minimum and maximum voltages in tile i, respectively, then $V_{max,i}-V_{min,i}$ is used as a metric for tile generation. In an embodiment, the chip, or network, 100 is initially divided into uniform tiles 105 of very small size. Then neighboring tiles 105 whose joint $V_{max}-V_{min}$ is minimum are continuously merged until the LP problem size is reasonably manageable. In another embodiment, tiles 105 could be cut through layers and thus could be treated as three-dimensional.

Through the box region-wise network optimization, the size of the optimization is reduced by a few orders of magnitude. Moreover, the method provides the flexibility of both wire sizing and topology changes (wire addition).

V. Decap/Wire Optimization

As discussed above, dynamic noise is suppressed through a combinational effort of decap insertion and/or wire enhancement. In this section, the total area of decap and number of wires 420 (FIG. 4) to be added is minimized, subject to the constraints that:

(i) the dynamic node voltages are higher than a user-specified minimum threshold;

(ii) the node voltages satisfy the MNA equations of the network 100 at any time point;

(iii) the capacitance that can be added at a node is bounded; and (iv) the wire widths that can be added between tiles 105 are bounded.

5.1 Merging LP Formulations of Equations (10) and (17)

The decap optimization method, and the wire optimization method, described above, follow the following framework: (i) reduce the original network 100 through region-wise sampling and macro modeling; and (ii) optimize the reduced network through a sequence of linear programming. Therefore, the LP formulation of the decap/wire co-optimization could be easily obtained by merging the LP formulation of wire optimization equation (17) and decap optimization equation (10).

In co-optimization, decap optimization and wire optimization use the same tiles 105 and select one node from each tile 105 as a sampling node. For each violation region 120, only the network 100 wires 420 of the nearby tiles 105, are optimized. The network 100 is macro modeled with the sampling nodes of the tiles 105 of the violation regions 120, thus abstracting away the bulk of the network 100.

The LP formulation of the wire optimization described above is built on a current-based macro model. In another embodiment, the LP formulation of wire optimization could be based on charge-based nodal equations (6) described above in Section 3.2. In this way, the MNA constraints of equation (7) and equation (16) could be merged into the following:

$$M \circ C + D' \cdot W \geq A \cdot Y + B \qquad (21)$$

$$\text{where } D' = \begin{bmatrix} (Y_2-Y_1)/\rho L_{12} & (Y_3-Y_1)/\rho L_{13} & (Y_4-Y_1)/\rho L_{14} & \cdots \\ (Y_1-Y_2)/\rho L_{12} & & & \cdots \\ & (Y_1-Y_3)/\rho L_{13} & & \cdots \\ & & (Y_1-Y_4)/\rho L_{14} & \vdots \\ \vdots & \vdots & \vdots & \vdots \end{bmatrix} \qquad (22)$$

is obtained by replacing Vi with Yi in matrix D of equation (15). The term $M \circ C$ is the vector of charges flowing from the decaps into the network 100 through the sampling nodes, and the term "$D' \cdot W$" is the vector of the charges flowing through the wire 420 candidates. Both sources of charges could help with pulling up the voltage to the user-specified minimum threshold level $V_{thre}$.

5.2 The Complete LP Formulation

The complete LP formulation of the co-optimization problem for a violation region 120 (FIG. 1) is as follows:

$$\text{minimize } \alpha \cdot \Sigma_i C_i/ds + (1-\alpha) \cdot \Sigma_{ij} W_{ij} L_{ij} \qquad (23)$$

subject to $M \circ C + D' \cdot W \geq A \cdot Y + B$ $C_i \leq C_{max,j}, \forall$ tile i ∈ violation region $W_{ij} \leq W_{max,ij}, \forall$ ij ∈ wire candidates where variable vector:

$C = [C_1, C_2, \ldots, C_m]^T$ represents the decap amount to be added at the sampling nodes, and $W = [W_{12}, W_{13}, \ldots, W_{mk}]^T$ represents the wire widths to be added between the sampling nodes, and where the constant parameter:

ds is the capacitance density of the decap cells for a given technology. $W_{ij}$ and $L_{ij}$ are the wire 420 (FIG. 4) width and length, respectively. The term "$\Sigma_i C_i/ds$" is the area of additional decap and the term "$\Sigma_{ij} W_{ij} L_{ij}$" is the area of additional wires 420;

$C_{max,j}$ is set depending on local congestion and decap density. Routing resource constraints between box regions 410 or the tiles 105 are imposed through $W_{max,i,j}$;

A and B are the conductance matrix and equivalent charge vector of the sampling nodes;

E, defined in equation (11), represents the voltage threshold;

M, defined in equation (11), evaluates the charge flowing out of the decap to be added; and D', defined in equation (22), evaluates the charge flowing through the wire 420 candidates.

The constant parameters D' and M rely on the voltages of the sampling nodes. These are updated at each LP iteration. The decap/wire update procedure is discussed in Section 5.3, below.

5.3 LP Iterations and Decap/Wire Updates

A preferred embodiment of the complete iterative LP and decap/wire update method is as follows:

Step 1. Set iteration index p=0 and the initial value of $A^0$, $B^0$, $V^0$, and $Y^0$. Values for $A^0$ and $B^0$ are obtained through the macro modeling procedure described above. $V^0$ is obtained from the initial transient analysis results. $Y^0$ is calculated as $Y^0 \int_{ts}^{te} V^0 dt$.

Step 2. Update $M^p$ and $D^{tp}$. By plugging $V^p$ into equation (11), we can get $M^p$. By substituting $Y^p$ into equation (22), we can get $D^{tp}$.

Step 3. Determine the decap budget $C^p$ and the wire 420 widths $W^p$ by solving the LP equation (23).

Step 4. Limit the step length. Since the term $[(Y_i-Y_j)/\rho L_{ij}]$ varies with $W_{ij}$, the change in $W_{ij}$ is kept small enough so that $[(Y_i-Y_j)/\rho L_{ij}]$ is still valid for evaluating the influence of the term $W_{ij}$ on the charge flowing through the wire 420. This is true also for $C_i$. Given the max step size for capacitance, $C\sigma$, and max step size for wire 420 width, $W\sigma$, as follows:

If $C^p_i \geq C\sigma, C^p_i = C\sigma$;

If $W^p_{ij} \geq W\sigma, W^p_{ij} = W\sigma$.

Step 5. Update $A^p$ and $B^p$ by stamping the new decap C and the new wires 420 W into A and B. The term "stamping" means for the prior sentence those new values for vectors C and W are entered into matrix A and vector B. The stamping of W into matrix A is straightforward, and is the same as the regular conductance stamping of a MNA. C is stamped into $A^p$ and $B^p$ through the assumption in equation (8). By substituting $V_i = [2Y_i/(t_e-t_s)] - V_{0,i}$, the total charge flowing into node i from the capacitance $C_i$ becomes:

$Q_i = (V_{0,i} - V_i) \times C_i = 2V_{0,i}C_i - [2Y_i/t_e-t_s]C_i$.

After stamping the term "$2V_{0,i}C_i, \forall$ i ∈ SP" into $B^p$, and the term "$2C_i/(t_s-t_e), \forall$ i ∈ SP" into the diagonal position of $A^p$, the charge nodal equations of the macro model become:

$$A^p \cdot Y^p + B^p = 0. \qquad (24)$$

Step 6. Update $Y^p$ and $V^p$. $Y^p$ represents the average voltage multiplied by the time period $[t_s, t_e]$ after the new capacitance and new wires 420 are added, which is obtained by solving the linear system of equation (24). $V^p$ indicates the voltage value at time point $t_e$ after the new capacitance and new wires 420 are added. By applying the approximation equation (8), $V^p_i = [2Y^p_i/(t_e-t_s)] - V_{0,i}$ is achieved.

Step 7. If $V_p \geq V_{thre}, \forall$ i ∈ SP, then stop; else set p=p+1 and go to Step 2 to continue.

Note that all the above operations are performed on the reduced network that consists only of the sampling nodes of the violation region 120. Since $|W|<2$ m, and all the other vectors are of dimension m, the computations for the LP in Step 3 and the linear solutions in Step 6 are in the order of m.

5.4 Overall Flow

A preferred embodiment of the overall flow of the decap/wire co-optimization is, as follows:

Step A. Run transient analysis of the power network 100. The network 100 includes intrinsic capacitances, and pre-placed decoupling capacitances (not shown).

Step B. Inspect the results of the transient analysis and determine violation regions 120, violation time windows and sampling nodes. If no violation region 120 is found, then stop, because the optimization is completed; otherwise, continue with Step C, below.

Step C. For each violation region 120, determine the optimal wires 420 and decap to be added in the macro modeling-reduced network. This is done by running a few iterations of a linear program described above. For violation regions 120 that overlap each other, the optimization for these regions is done simultaneously.

Step D. Perform detailed routing of the wires 420 between the tiles 105 in the original network 100. Distribute the decap for the sampling nodes of the tiles 105 in the hot spot 110 evenly within the tiles 105 of the respective violation region 120, and go to Step A, above to continue.

As shown above, the optimization and transient analysis verification (Steps B-D) are run iteratively, until the voltage constraints are satisfied. The reason this procedure may need more than one iteration is that the various approximations discussed before may cause the decap/wire to be under/overestimated slightly. If underestimated, several iterations may be needed to gradually approach the final solution. Constraints are satisfied typically in 1-2 iterations.

Figure 5:
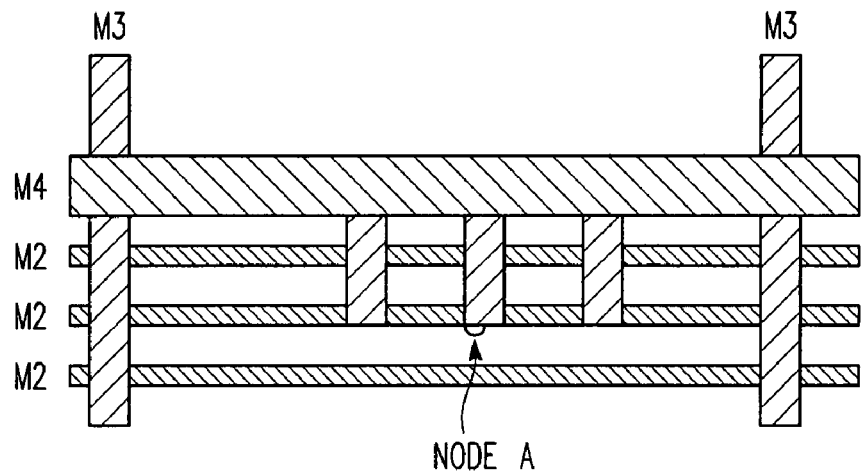
FIG. 5 is a diagram illustrating enhanced local wiring after co-optimization according to preferred embodiments of the invention.

FIG. 5 illustrates an embodiment of the invention where local wiring enhancements alone were utilized to reduce dynamic noise fluctuations by adding several wire paths 420 (FIG. 4) between a sampling node A which has a large IR drop and is within a violation region 120 (FIG. 1). Node A is located on metal layer M2. The current path between node A located on metal layer M2 and the supply voltage provided on layer M4 is detoured by thin M2 segments inside the standard cells (not shown) which were abutted to one another. Because of the lack of available white space around node A due to circuit density, adding decap to alleviate the large IR drop is not feasible. In this embodiment, new metal strips, or wire paths, M3 were added to the violation region 120 to allow better current flow from node A to strip M4 thereby improving the voltage at node A without adding any decap in or around the violation region 120.

A semiconductor device (not shown), and circuitry within the semiconductor device, can be manufactured in accordance with one or more of the decoupling capacitance budgeting methods described herein. In this way, supply noise within the circuitry, or network, of the semiconductor device would be optimally reduced.

Figure 6:
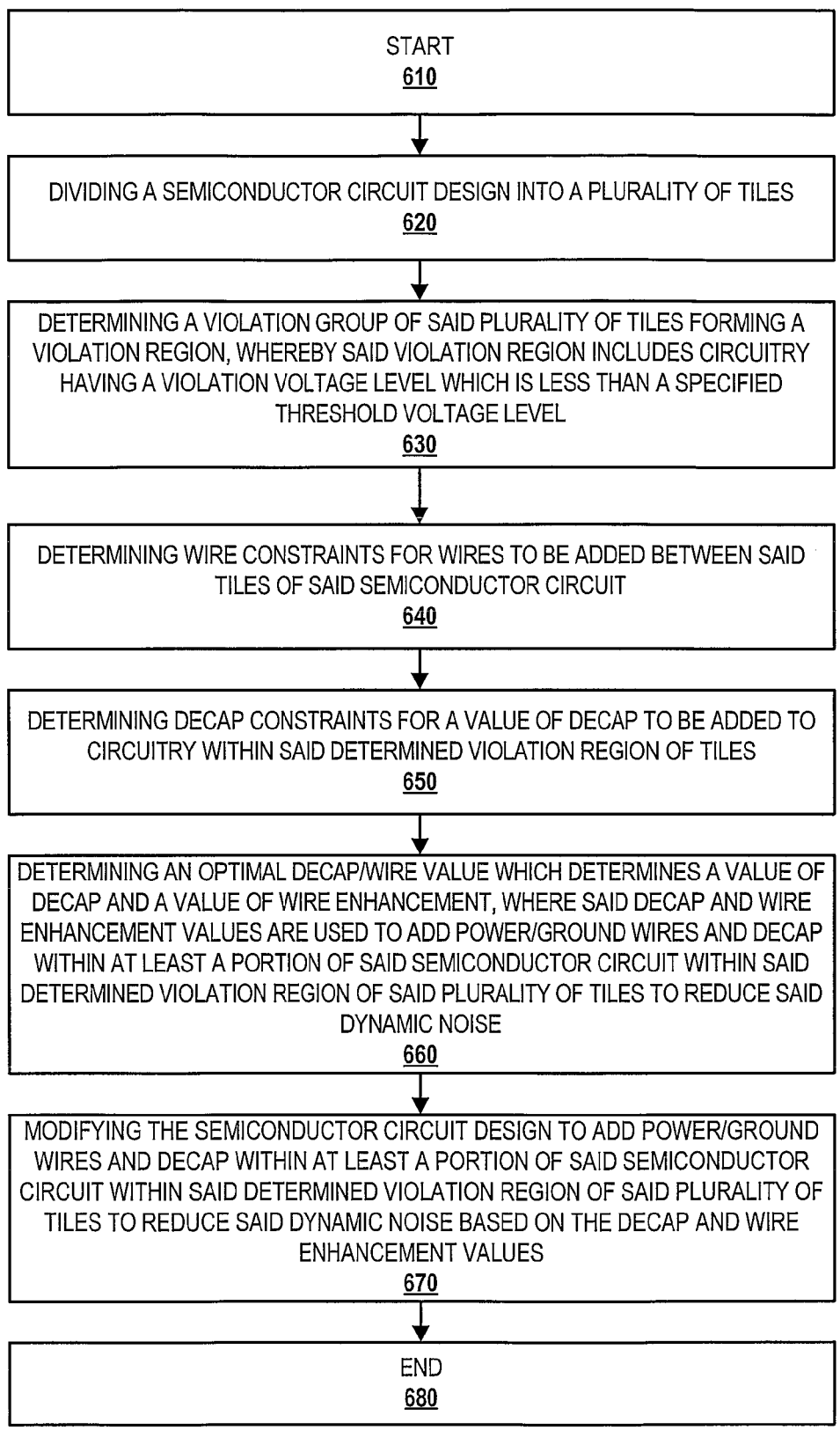
FIG. 6 is a flow diagram according to preferred embodiments of the invention.

FIG. 6 shows a flow diagram of a method of reducing the dynamic noise of a power network of a semiconductor circuit. The process (600) staffs at step 610 and proceeds through the steps of: a) dividing a semiconductor circuit design into a plurality of tiles (step 620); b) determining a violation group of said plurality of tiles forming a violation region, whereby said violation region includes circuitry having a violation voltage level which is less than a specified threshold voltage level (step 630); c) determining wire constraints for wires to be added between said tiles of said semiconductor circuit (step 640); d) determining decap constraints for a value of decap to be added to circuitry within said determined violation region of tiles (step 650); e) determining an optimal decap/wire value which determines a value of decap and a value of wire enhancement, where said decap and wire enhancement values are used to add power/ground wires and decap within at least a portion of said semiconductor circuit within said determined violation region of said plurality of tiles to reduce said dynamic noise (step 660); and f) modifying the semiconductor circuit design to add power/ground wires and decap within at least a portion of said semiconductor circuit within said determined violation region of said plurality of tiles to reduce said dynamic noise based on the decap and wire enhancement values (step 670).

Figure 7:
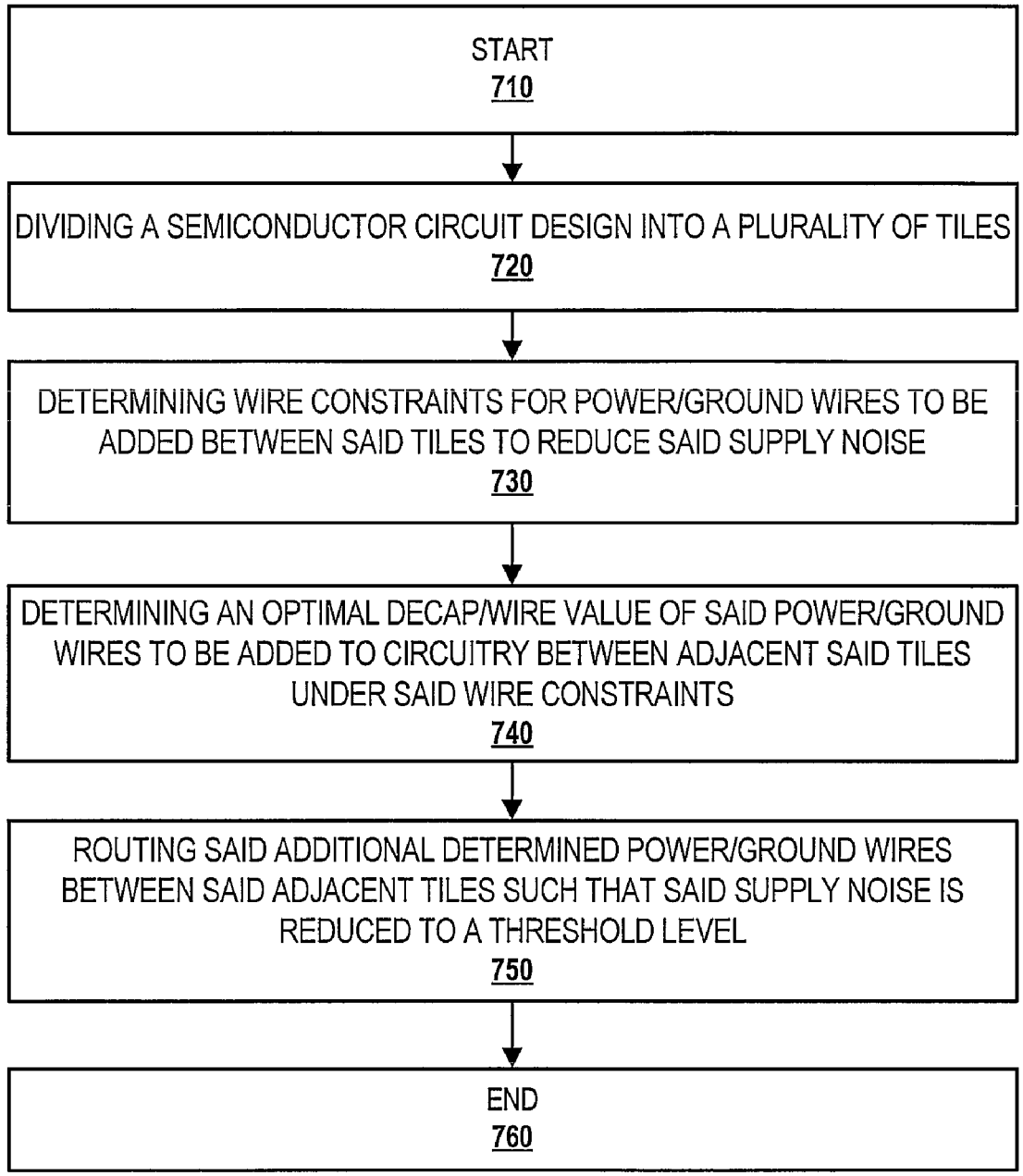
FIG. 7 is a flow diagram according to preferred embodiments of the invention.

With reference to FIG. 7, there is shown a method of determining additional power/ground wires to be added to a semiconductor circuit to reduce the power supply noise. The method (700) shown in FIG. 7 staffs at step 710 and proceed to through the steps of: a) dividing a semiconductor circuit design into a plurality of tiles (step 720); b) determining wire constraints for power/ground wires to be added between said tiles to reduce said supply noise (step 730); c) determining an optimal decap/wire value of said power/ground wires to be added to circuitry between adjacent said tiles under said wire constraints (step 740); and d) routing said additional determined power/ground wires between said adjacent tiles such that said supply noise is reduced to a threshold level (step 750).

As will be appreciated, the methods in preferred embodiments may be implemented using any combination of computer programming software, firmware or hardware. For example, an article of manufacture containing the computer programming code is used by either executing the code directly from the storage device, by copying the code from the storage device into another storage device such as a hard disk, RAM, etc., or by transmitting the code for remote execution. The method may be practiced by combining software and/or hardware to complete the steps of a preferred embodiment. An apparatus for practicing a preferred embodiment could be one or more computers and storage systems containing or having network access to computer program(s) coded in accordance with a preferred embodiment. A semiconductor device may be manufactured in accordance with the method in preferred embodiments using design or test software which incorporates one or more of the methods in a preferred embodiments to determine decap values, the placement of those determined decap values and/or local wire enhancements of the circuitry of such a manufactured semiconductor device.

While the invention has been particularly shown and described with reference to preferred embodiments, it will be understood by those skilled in the art that various changes in form and detail may be made therein without departing from the spirit and scope of a preferred embodiment. Any variations, modifications, additions, and improvements to the embodiments described are possible and may fall within the scope of the invention as detailed within the following claims.

What is claimed is:

1. An article of manufacture comprising machine-readable medium including program logic embedded therein that when executed by a machine cause a method of reducing the dynamic noise of a power network of a semiconductor circuit (100), comprising the steps of:
    a) dividing a semiconductor circuit (100) design into a plurality of tiles (105);

b) determining a violation group of said plurality of tiles (105) forming a violation region (120), whereby said violation region (120) includes circuitry having a violation voltage level (225) which is less than a specified threshold voltage level (220);

c) determining wire constraints for wires (420) to be added between said tiles (105) of said semiconductor circuit (100);

d) determining decap constraints for a value of decap to be added to circuitry within said determined violation region (120) of tiles (105);

e) determining an optimal decap/wire value which determines a value of decap and a value of wire enhancement, where said decap and wire enhancement values are used to add power/ground wires (420) and decap within at least a portion of said semiconductor circuit (100) within said determined violation region (120) of said plurality of tiles (105) to reduce said dynamic noise; and f) modifying the semiconductor circuit design based on said decap and wire enhancement values to add power/ground wires and decap within at least a portion of said semiconductor circuit within said determined violation region of said plurality of tiles to reduce said dynamic noise.

2. The method of claim 1, wherein step e) includes the step of routing wires (420) between selected said tiles (105) of said semiconductor circuit (100) and distributing said decap value to said circuitry within said violation region (120) of said plurality of tiles (105), whereby said wire routing and decap distribution reduces said dynamic noise of said power network (100).

3. The method claim 2, further including a step of determining a minimized decap/wire area in said violation region (120) in which to add said power/ground wires (420) and said decap such that adding said wires (420) and said decap is subject to modified nodal approach (MNA) constraints and voltage threshold constraints and is relaxed into charge-based inequality constraints.

4. The method of claim 1, wherein said step of determining a optimal decap/wire value is accomplished after reducing said power network (100), which is accomplished by selecting nodes of tiles (105) in said violation region (120) having the worst noise as sampling nodes and determining a macro model of circuitry which includes said sampling nodes.

5. The method of claim 1, wherein said power/ground wires (420) are to be added only between adjacent tiles (105) in said violation region (120).

6. The method of claim 1, wherein said step of determining said decap value and said wire enhancement value is accomplished using linear program steps.

7. The method of claim 1, wherein said step of determining an optimal decap/wire value includes the step of dividing at least a portion of said network (100) into tiles (105) and connecting circuitry in at least one of said tiles (105) located within said voltage violation region (120) to circuitry in at least one of another of said tiles (105) located outside said voltage violation region (120).

8. An article of manufacture comprising machine-readable medium including program logic embedded therein that when executed by a machine cause a method of determining additional power/ground wires (420) to be added to a semiconductor circuit (100) to reduce the power supply noise, comprising the steps of:

a) dividing a semiconductor circuit (100) design into a plurality of tiles (105);

b) determining wire constraints for power/ground wires (420) to be added between said tiles (105) to reduce said supply noise;

c) determining an optimal decap/wire value of said power/ground wires (420) to be added to circuitry between adjacent said tiles (105) under said wire constraints; and d) routing said additional determined power/ground wires (420) between said adjacent tiles (105) such that said supply noise is reduced to a threshold level (220).

9. The method of claim 8, wherein said step of determining said optimal value of power/ground wires (420) is accomplished by selecting nodes of said plurality of tiles (105) having the worst supply noise condition as sampling nodes and determining a macro model of circuitry of said semiconductor circuit (100) containing said sampling nodes.

10. The method of claim 9, wherein said step of determining a macro model is accomplished by computing a multinodal linear element that models at least a portion of said power network of said semiconductor circuit (100).

11. The method of claim 8, wherein said step of dividing a semiconductor circuit (100) design is accomplished wherein said tiles (105) are uniform in size and are sufficiently small whereby adjacent said tiles (105) are merged whose joint value for $(V_{max}-V_{min})$ is minimum.

12. The method of claim 8, wherein said step of determining wire constraints is accomplished by counting the number of track wires not occupied by an existing signal and power/ground wires (420) in a region comprised of at least two adjacent tiles (105).

13. The method of claim 8, wherein said power/ground wires (420) are to be added only between adjacent tiles (105) in said violation region (120).

* * * * *